United States Patent [19]

Podell

[11] Patent Number: 4,633,096
[45] Date of Patent: Dec. 30, 1986

[54] HIGH CURRENT DIODE PULSE MODULATOR

[75] Inventor: Allen F. Podell, Palo Alto, Calif.
[73] Assignee: TRW Inc., Redondo Beach, Calif.
[21] Appl. No.: 549,368
[22] Filed: Nov. 4, 1983
[51] Int. Cl.⁴ ............................ H03K 3/01; H03K 5/01
[52] U.S. Cl. ..................................... 307/268; 307/270
[58] Field of Search ............... 307/234, 265, 268, 270, 307/290, 296 A, 297; 375/22, 24; 332/9 R, 9 T, 14

Primary Examiner—Stanley D. Miller
Assistant Examiner—Timothy P. Callahan
Attorney, Agent, or Firm—Robert M. Wallace; Donald R. Nyhagen

[57] ABSTRACT

In an IMPATT diode modulator, a circuit including a free-running oscillator drives the input of a plurality of Schmitt triggers connected in parallel, whose outputs together drive the base of a PNP bipolar transistor connected between positive and negative supply voltages at its collector and emitter through a pulse forming network. The collector voltage of the bipolar transistor drives the gates of a plurality of N-channel V-MOS-FET's connected in parallel at their sources and drains between the positive and negative rail voltages.

8 Claims, 1 Drawing Figure

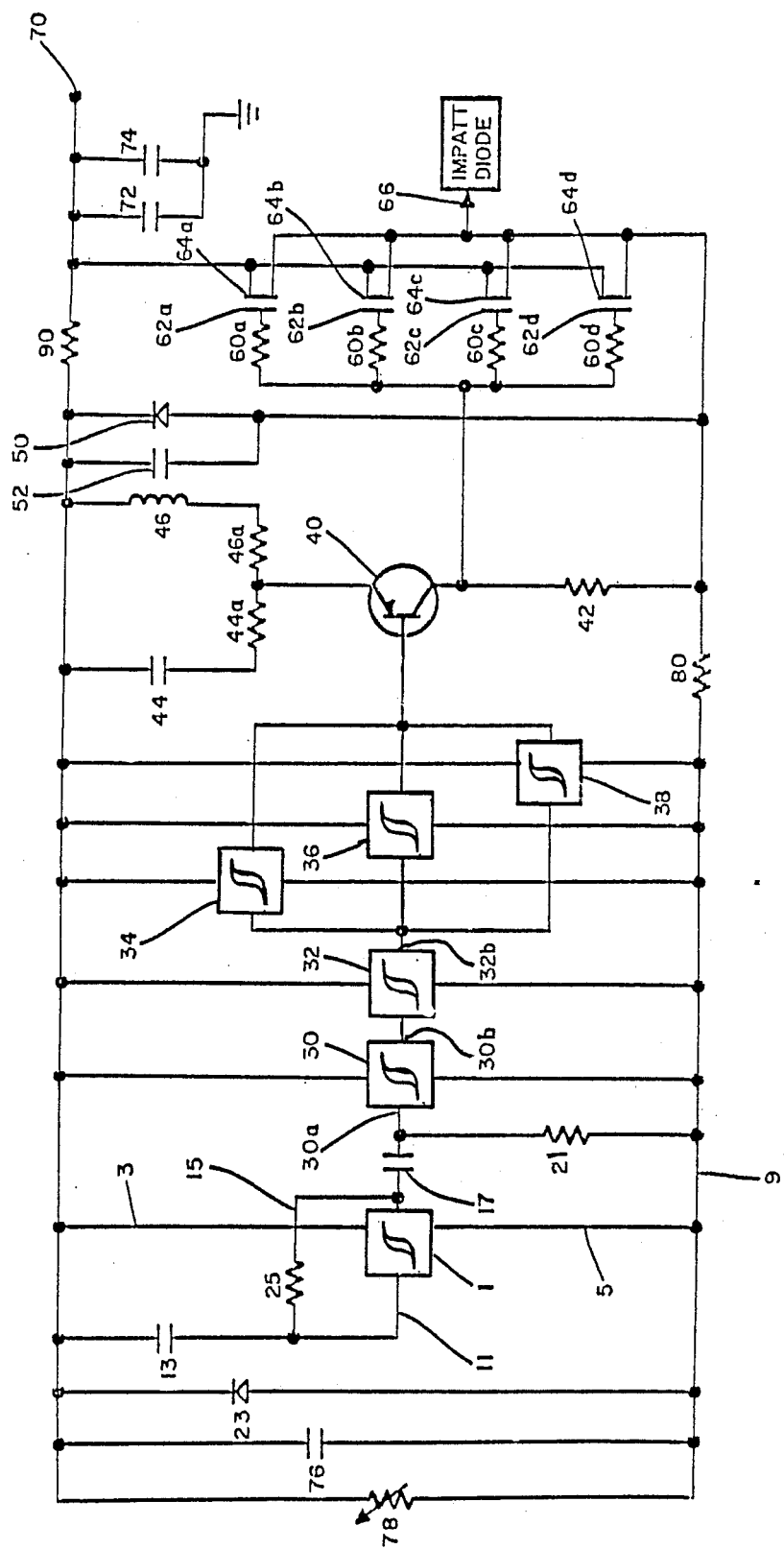

HIGH CURRENT DIODE PULSE MODULATOR

BACKGROUND OF THE INVENTION

In the field of radar systems, there exists a need for an extremely compact modulator capable of delivering 10 ampere 100 nanosecond pulses to an amplifier device such as an IMPATT Diode of the type well known in the art. For example, driving an IMPATT Diode with 10 ampere pulses having a 100 nano second pulse-width usually requires a hybrid circuit having a relatively large volume of 400 cubic centimeters due the high number of components and having excessive heat dissipation. Such circuitry usually requires external timing to define the width and repetition rate of the pulses delivered to the IMPATT Diode.

In IMPATT Diode can serve as an amplifier device to generate high power pulses in response to the pulses delivered by the control circuit described here. The high power response of the IMPATT Diode may be used, for example, as the transmitter source for a radar.

There is a need for a hybrid circuit capable of delivering 10 ampere, 100 nano second pulses with low heat dissipation, low current consumption in a volume less than 60 cubic centimeters without requiring any external triggering or clock circuits.

SUMMARY OF THE INVENTION

The present invention is a compact, low cost, high current source of DC pulses having fast rise times, which is internally triggered so as to not require any external clocks or trigger sources and is easily hybridized.

In the circuit of the present invention, a first inverting Schmitt trigger, in combination with a feedback RC network, provides internal triggering to generate a square wave output in the manner of a free-running oscillator. The square wave output is applied through a second RC network to the input of a second Schmitt trigger. The second RC network discharges the square wave voltage applied to the second Schmitt trigger input to below the turn-off threshold of the second Schmitt trigger within 100 nano seconds. Thus, each positive going square wave pulse initially raises the second Schmitt trigger input voltage above its turn-on threshold, and the input voltage is then discharged below its turn-off threshold within 100 nano seconds through the second RC network. The second Schmitt trigger is thus turned on and off within 100 nano seconds.

The resulting 100 nano second pulse output of the second Schmitt trigger is applied to the inputs of a plurality of Schmidt triggers connected in parallel. The plurality of parallel of Schmitt triggers generates a pulse defined by the action of the first Schmitt trigger but having a greater current in proportion to the number of Schmitt triggers connected in parallel. The outputs of the parallel Schmitt triggers drive the base of a bipolar transistor connected between the positive and negative rail voltages at its collector and emitter through a pulse forming network. The collector voltage of the bipolar transistor drives the gates of a plurality of metal oxide semiconductor field effect transistors (MOSFET's) connected in parallel at their sources and drains between the positive and negative rail voltages. The source-to-drain current of each of the MOSFET's is connected to the output node of circuit.

Use of the plurality of parallel Schmitt triggers permits the bipolar transistor to be driven to a 1 ampere emitter-to-collector current without saturating it. As a result, the rise and fall times of the bipolar transistor collector current are less than ten nano seconds. The configuration of this circuit permits the use of N-channel V-MOS power field effect transistors to be used for the four parallel MOSFET's instead of the more conventional P-channel MOSFET. The use of N-channel V-MOSFET's results in lower drive requirements and faster switching.

The advantages of the circuit of this invention are that the 400 cubic centimeter size of typical 100 nano second pulse generators is reduced to about 10 cubic centimeters without sacrificing performance and the current consumption is only about 10 milli-amperes. Also, because the circuit is self-triggering, there is no requirement for external clock signals, a significant advantage in high performance compact electronic systems.

DESCRIPTION OF THE DRAWING

The accompanying drawing is a schematic diagram of the high current compact pulse circuit of this invention.

DETAILED DESCRIPTION OF THE INVENTION

A first Schmitt trigger 1 has its positive and negative supply terminals 3, 5 connected between positive and negative rails 7, 9 respectively and its input terminal 11 connected through a first capacitor 13 to the positive rail 7, its output terminal 15 connected through a second capacitor 17 to the input of a second Schmitt trigger 30, and through a second resistor 21 to the negative rail 9. The maximum voltage difference between the two rails 7 and 9 is limited by a Zener diode 23 connected therebetween.

The Schmitt trigger 1 is commercially available and is of the inverting type which produces a negative going pulse at its output terminal 15 in response to a rising input voltage at its input terminal 11 as soon as the input voltage passes a certain "turn-on" threshold voltage and until the input voltage at terminal 11 falls below a second (usually lower) threshold "turn-off" voltage.

In operation, when the circuit of the accompanying figure is first turned on by applying a constant DC positive supply voltage to a positive rail 7, the capacitor 13 is charged positively until the threshold voltage at the input terminal of the Schmitt trigger 1 passes the turn-on threshold voltage. As soon as this occurs, a negative going pulse is generated at the output terminal 15, thus discharging the capacitor 13 through a feedback resistor 25 connected across the input and output of the Schmitt trigger 1. As the capacitor 13 is discharged by the negative going pulse at the terminal 15 of the Schmitt trigger 1, the input voltage at the terminal 11 of the Schmitt trigger 1 decreases until it falls below the turn-off threshold voltage of the Schmitt trigger 1, thus causing the negative-going pulse at output terminal 15 to be turned off. At this point, the process has recycled and begins again. As can be seen, the resulting nearly square-wave pulse output of the Schmitt trigger 1 at its terminal 15 has a repetition rate controlled, at least partially, by the capacitance of the capacitor 13 and the resistance of the resistor 25. The Schmitt trigger 1 and the RC network 13, 25 thus functions as a free-running oscillator.

The square wave output of the Schmitt trigger 1 is connected to one side of a capacitor 17, the other side of the capacitor 17 being connected through a resistor 21 to the negative rail 9 and to the input 30a of the second inverting Schmitt trigger 30. Each time the capacitor 17 is charged on a positive-going edge of the square wave output of the first Schmitt trigger 1, the second Schmitt trigger 30 is turned on. However, within 100 nano seconds, the voltage across the capacitor 17 is discharged through the resistor 21 to below the turn-off threshold of the second Schmitt trigger 30. Thus, the second Schmitt trigger 30 is turned on and off within 100 nano seconds.

The resulting 100 nano second negative pulse output present at the output terminal 30b of the Schmitt trigger 30 will not have "clean" rising and falling edges, due to the action of the capacitors 13 and 17. Accordingly, a third inverting Schmitt trigger 32 receives the output pulse from the Schmitt trigger 30 at its input terminal to produce a positive-going pulse at its output terminal 32(b) having the same pulse width and repetition rate but also having much faster rise and fall times and much cleaner rising and falling edges. This enhanced pulse is applied to the inputs of a parallel array of three inverting Schmitt triggers 34, 36, 38, their outputs in turn being connected to the base of PNP bipolar transistor 40 to apply a 100 nanosecond negative-going pulse to the base.

Each of the Schmitt triggers 30-38 has its positive supply terminal connected to the rail 7 and its negative supply terminal connected to the rail 9. The array of parallel Schmitt triggers 34, 36, 38 in effect triples the amount of current applied to the base of the bipolar transistor 40, thus enhancing the resulting emitter-to-collector current of the transistor 40. The collector current across the resistor 42 follows the pulse repetition rate and pulse-width defined by a RC network connected across the first Schmitt trigger 1 and operates in synchronism with the three parallel Schmitte triggers 34, 36 and 38.

The emitter of the transistor 40 is connected through a pulse shaping network 44, 46 to the positive rail 7 and the collector is connected through a collector resistor 42 to the negative rail 9. The pulse-forming network comprises the capacitor 44 connected through a resistor 44(a) to the emitter of the transistor 40 and an inductor 46 connected through another resistor 46(a) to the emitter of the transistor 40.

A Zener diode 50 and a storage capacitor 52 are connected in parallel and across the positive and negative rails 7 and 9 adjacent the rail connections to the emitter and collector of the transistor 40. The capacitor 52 stores a maximum charge defined by the Zener diode 50 and functions as a filter to reduce or suppress any ripple in the supply voltage across the rails 7 and 9 which may occur each time the transistor 40 is turned on. Since the duration of the pulse supplied by the Schmitt trigger array 34, 36, 38 to the base of the transistor 40 will be very short (on the order of nano seconds) a 22 volt charge is usually sufficient for the storage capacitor 52. Accordingly, the Zener diode 50 has a breakdown voltage preferably on the order of 22 volts.

The voltage across the collector resistor 42 is applied through gate resistors 60 a, b, c, d to gates 62 a, b, c, d of power MOSFET's 64 a, b, c, d. The gate resistors 60 a, b, c, d suppress oscillations in the gate voltages of each of the MOSFET's 64 a, b, c, d. The sources and drains of the power MOSFET's 64 a, b, c, d are connected in parallel to the negative and positive rails 9 and 7 respectively, the sources of each of the MOSFET's 64 being connected together to a common output node 66. The four parallel MOSFET's 64 each supply on the order of thres amperes of current to the output node 66, so that the total output current can be between 9 and 12 amperes with a 100 nano second pulse width. The use of the plurality of parallel Schmitt triggers to drive a plurality of parallel MOSFET's 64 through a buffer amplifier comprising the PNP transistor 40 permits the use of N-channel V-MOSFET'S for the transistors 64 a, b, c, d. The V-MOSFET's have a lower drive requirement and faster switching times than do the conventional P-channel devices.

The positive rail 7 is connected to a supply voltage on the order of 40 volts DC at a supply terminal 70 which is connected across two capacitors 72, 74 to ground. Another capacitor, 76 is connected between the positive and negative rails 7, 9 and a variable resistor 78 is also connected there-between. The pulse amplitude at the output node 66 maybe adjusted by varying the resistor 78 to a maximum amplitude limited by the Zener diode 23. The capacitor 76 acts as a ripple filter.

Preferably, the output terminal 66 is connected to drive an IMPATT diode with a series of nano second pulses. A DC bias current is constantly applied at the terminal 66 to the IMPATT diode, the current being selected to match the characteristics of the IMPATT diode. Accordingly, this selection is made possible by the provision of a resistor 80 connected in series between the resistor 21 and resistor 42. The DC bias current applied to the diode flows through the resistor 80.

A circuit of the type illustrated in the accompanying figure was constructed. The six Schmitt triggers, 1, 30, 32, 34, 36 and 38 were implemented in an integrated circuit part number NM74HC14N available through National Semiconductor in Sunnyvale, Calif. and the four V-MOSFET's 64 a, b, c, d were implemented on part number VN206ND available from Supertech in Sunnyvale, Calif. The Zener diode 50 is part number 1N4748 and the Zener diode 23 is part number 1N4734, both being generally available throughout the industry. The bipolar transistor 40 was a PNP transistor part number 2N3467 also generally available throughout the industry. The values of each of the passive components in either Ohms, Farads or Henries, as applicable, were as follows:

| Numeral | Value | Numeral | Value |
|---|---|---|---|
| 13 | 750 pf | 72 | 1 μf |
| 17 | 27 pf | 74 | 1 μf |
| 21 | 3.3k | 76 | .1 μf |
| 25 | 33k | 78 | 5kΩ |
| 42 | 18 Ω | 80 | 1.5kΩ |
| 44 | 330 pf | 90 | 330 Ω |
| 44a | 8 Ω | | |
| 46 | 50 nano-H | | |
| 46a | 16 Ω | | |
| 52 | .1 μf | | |
| 60,a,b,c&d | 1 Ω | | |

The resulting circuit exhibited an output of 10 ampere pulses with a pulse-width of 100 nano seconds, a pulse repetition rate of 50 kilo-hertz and a current consumption at the supply terminal 70 of 100 milli-amperes. The circuit was constructed as a hybrid and occupied less then 10 cubic centimeters. The small size was due in part to the lack of connections to supply external triggering or clock signals.

What is claimed is:

1. A high current compact pulse generator comprising:
   a free-running oscillator;
   a first Schmitt trigger;
   a first capacitor connected in series between said free-running oscillator and the input of said first Schmitt trigger;
   resistor means for rapidly discharging said capacitor;
   a plurality of Schmitt triggers having their inputs coupled in parallel to the output of said first Schmitt trigger;
   a drive transistor having an emitter and a collector connected across a voltage source and its base connected to the outputs of said plurality of parallel Schmitt triggers;
   current amplifying means comprising a plurality of power transistors each having a source and a drain connected in parallel across said voltage source and a gate coupled to the collector of said drive transistor; and
   an output node connected to one of the source or drain of each of said plurality of parallel power transistors.

2. The device of claim 1 wherein said free-running oscillator comprises an inverting Schmitt trigger and a feedback resistor-capacitor network connected between the input and output of said inverting Schmitt trigger.

3. The device of claim 1 further comprising one additional Schmitt trigger connected between the output of the first Schmitt trigger and the input of said plurality of parallel Schmitt triggers.

4. The device of claim 1 further comprising a pulse forming network connected between said emitter of said drive transistor and said voltage source and a collector resistor connected between the collector of said drive transistor and said voltage source.

5. The device of claim 1 further comprising a ripple filter, including a zener diode and capacitor connected in parallel across said voltage source.

6. The device of claim 1 further comprising a plurality of gate resistors connected between the collector of said driver transistor and each of the gates of said power transistors.

7. The device of claim 1 wherein said plurality of power transistors comprise V-MOS power field effect transistors.

8. The device of claim 7 wherein said drive transistor comprises a PNP bipolar transistor and said power transistors comprise N-channel devices.

* * * * *